United States Patent [19]

Shimazu

[11] Patent Number: 5,718,574
[45] Date of Patent: Feb. 17, 1998

[54] HEAT TREATMENT APPARATUS

[75] Inventor: Tomohisa Shimazu, Minato-ku, Japan

[73] Assignee: Tokyo Electron Limited, Tokyo-to, Japan

[21] Appl. No.: 607,643

[22] Filed: Feb. 27, 1996

[30] Foreign Application Priority Data

Mar. 1, 1995 [JP] Japan ................ 7-067047

[51] Int. Cl.$^6$ ........................ F27D 5/00
[52] U.S. Cl. ............ 432/253; 432/258; 432/259; 432/241; 432/5; 432/6; 269/296
[58] Field of Search ............ 432/253, 258, 432/259, 241, 5, 6, 11, 152; 248/346.01, 346.05; 269/903, 296, 29

[56] References Cited

U.S. PATENT DOCUMENTS

| | | | |
|---|---|---|---|
| 3,958,924 | 5/1976 | Egenolf et al. | 432/259 |
| 4,480,990 | 11/1984 | Beam et al. | 432/253 |
| 4,802,842 | 2/1989 | Hirayama | 432/5 |
| 5,044,752 | 9/1991 | Thurfjell et al. | |
| 5,067,695 | 11/1991 | Huddleston | 269/296 |
| 5,297,956 | 3/1994 | Yamabe et al. | |
| 5,310,339 | 5/1994 | Ushikawa | 432/253 |
| 5,316,472 | 5/1994 | Niino et al. | |
| 5,492,229 | 2/1996 | Tanaka et al. | |

FOREIGN PATENT DOCUMENTS

| | | |
|---|---|---|
| 4-133417 | 5/1992 | Japan. |
| 6-224146 | 8/1994 | Japan. |
| 7-161654 | 6/1995 | Japan. |
| 7-183359 | 7/1995 | Japan. |
| 7-312351 | 11/1995 | Japan. |

OTHER PUBLICATIONS

English language abstract of Japanese Pat. Appl. 2-256155 (Laid-Open 4-133417), May 7, 1992.
English language abstract of Japanese Pat. Appl. 5-031315 (Laid-Open 6-224146), Aug. 12, 1994.
English language abstract of Japanese Pat. Appl. 5-329829 (Laid-Open 7-161654), Jun. 23, 1995.
English language abstract of Japanese Pat. Appl. 5-347570 (Laid-Open 7-183359), Jul. 21, 1995.
English language abstract of Japanese Pat. Appl. 6-128127 (Laid-Open 7-312351), Nov. 28, 1995.

*Primary Examiner*—Henry A. Bennett
*Assistant Examiner*—Jiping Lu
*Attorney, Agent, or Firm*—Beveridge, DeGrandi, Weilacher & Young, LLP

[57] ABSTRACT

A substrate holding assembly for horizontally holding a substrate to be treated is provided in a heat treatment chamber of a heat treatment apparatus. The substrate holding assembly has an annular base, and a plurality of fixed support projections provided on the annular base, for holding the underside of the substrate to be treated. A flexible beam portion is fixed to the annular base, or to a vertical support rod, and a flexible support projection is provided on the beam portion, for flexibly supporting a portion of the substrate to be treated which tends to flex downward under its own weight. Flexure caused by the own weight of the substrate to be treated held in the substrate holding assembly is thus corrected by the flexible holding portions. Accordingly, stresses caused in the substrates to be treated can be decreased or removed, and occurrence of slips in the substrate to be treated can be precluded in a high-temperature heat treatment. Accordingly, high yields can be obtained.

23 Claims, 5 Drawing Sheets

HEAT TREATMENT APPARATUS

TECHNICAL FIELD

The present invention relates to a heat treatment apparatus including substrate holding means for holding substrates to be processed in a horizontal orientation.

BACKGROUND ART

In fabrication of semiconductor devices heat treatment apparatuses of various types are used to subject semiconductor wafers which are substrates to be processed to oxidation, diffusion, CVD (Chemical Vapor Deposition), annealing, etc. The heat treatment apparatuses include substrate holding means, the so-called ladder boats, ring boats, etc., as means for holding the semiconductor wafers horizontally therein.

The ladder boat includes a plurality (3 to 4) of support rods which are arranged so as to be located around the wafers, and the support rods have concave or convex engagement portions which support the wafers in multistage fashion at a suitable vertical interval. The ring boat includes, in place of the engagement portions, rings which support the wafers at the undersides of peripheral portions thereof. The support rods and the rings are made of a material, e.g., quartz, which has heat resistance and is not contaminative.

In the above-described heat treatment apparatuses, however, the holding means support the wafers mainly at the undersides of parts of peripheral portions of the wafers, which makes central portions of the wafers flex downward by their own weight. Stresses caused by this flexure make slips (deformations in crystals) in the wafers in especially high-temperature heat treatments, and low yields are unavoidable. This has become a problem. This problem is more serious with wafers of larger diameters, such as a 12-inch diameter. What are proposed as countermeasures to such problem is, for example, to support the wafers on the surfaces uniformly at a number of support points, or to support the wafers on the surfaces uniformly by flat support plates. However, it is difficult to machine uniformly with high precision a number of support points or the flat support plates.

DISCLOSURE OF THE INVENTION

The present invention was made to solve the above-described problem, and an object of the present invention is to provide a heat treatment apparatus which can decrease or remove stresses of a substrate to be processed, and preclude slips in the substrate to be treated in high-temperature heat treatments, with a result of improved high yields.

A first characteristic of the present invention is a heat treatment apparatus comprising substrate holding means for supporting a substrate to be treated in a horizontal orientation, the substrate holding means comprising a fixed support portion for securely supporting an underside of the substrate to be treated, and a flexible support portion for flexibly supporting the underside of the substrate to be treated.

A second characteristic of the present invention is the above-described heat treatment apparatus, wherein the fixed support portion comprises a plurality of vertical support rods and an annular base horizontally mounted horizontal on said plurality of support rods and corresponding to a peripheral portion of the substrates to be treated; and a plurality of fixed support projections for supporting the underside of the peripheral portion of the substrate to be treated mounted on the annular base; and the flexible support portion comprises a beam portion fixed to the annular base and extended in the annular base, and a flexible support projection for supporting the underside of a central portion of the substrate to be treated.

A third characteristic of the present invention is the above-described heat treatment apparatus, wherein the fixed support portion comprises a plurality of vertical support rods, and engagement portions formed in said plurality of support rods, for supporting the underside of the peripheral portion of the substrate to be treated; and the flexible support portion comprises a beam portion extended inward from at least one of the support rods, and flexible support projections provided on the beam portion for supporting the underside of the central portion of the substrates to be treated.

According to the first characteristic, the substrate to be treated is supported at the underside of a part of thereof by the fixed support portion of the substrate holding means, and is supported by the flexible support portion at the underside of a part thereof which tends to be flexed by its own weight, whereby stresses caused in the substrate to be treated can be decreased as much as possible or removed. As a result, slips in the substrate to be treated W can be precluded in a high-temperature heat treatment, and accordingly higher yields can be obtained, and the substrate holding means is also applicable to the tendency of larger-diameter substrates to be treated. In addition, the fixed support portion can have three fixed support projections, and the three-point support does not require precision. This facilitates the machining of the substrate holding means.

According to the second characteristic, the substrate to be treated is supported at the underside of a part of the peripheral portion thereof by a plurality of fixed support projections of the annular base of the substrate holding means. The substrate is further supported at the underside of a part of the central portion thereof (which tends to flex under its own weight) by the flexible support projection by the use of, and flexibility of the beam portion extended from the annular base, flexure of the substrate is corrected. Stresses caused in the substrate can be decreased as much as possible or removed, and occurrence of slips in the substrate can be precluded in a high-temperature heat treatment. High yields can be obtained.

According to the third characteristic, each substrate to be treated is supported at the underside of a part of the peripheral portion by the engagement portions in the support rods of the substrate holding means, and at the underside of a part of the central portion thereof by the flexible support portion by the use of flexibility of the beam portion extended from the support rod, whereby flexure of the substrate is corrected. Stresses caused in the substrate can be decreased as much as possible or removed, and occurrence of slips in the substrate can be precluded in a high-temperature heat treatment, and high yields can be obtained. In addition, a number of substrates to be treated can be simultaneously heat-treated.

BRIEF DESCRIPTION OF THE DRAWINGS

FIG. 2 is a vertical sectional view of one example of vertical heat treatment apparatuses the present invention is applied to.

BEST MODES FOR CARRYING OUT THE INVENTION

Figure 2:
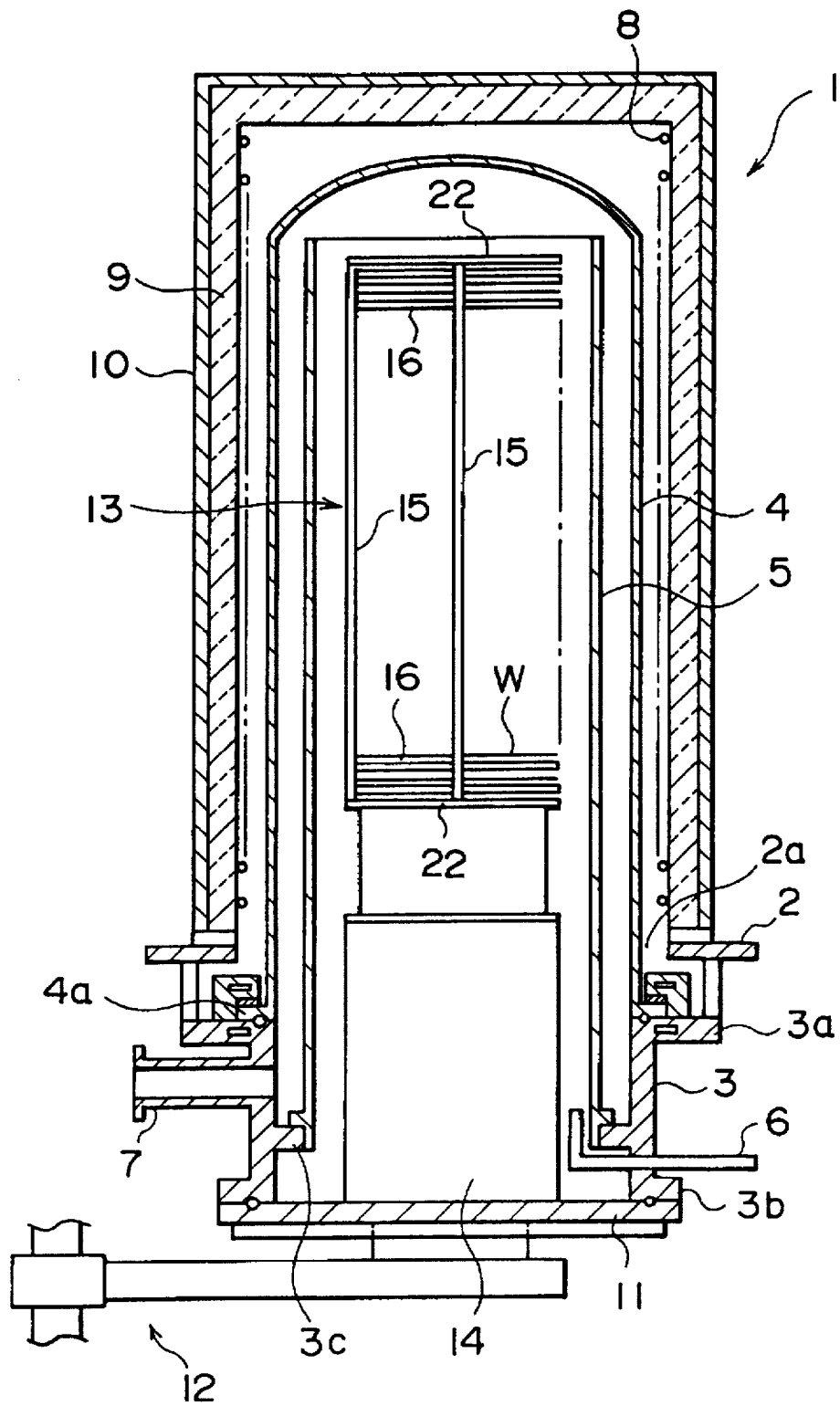

An embodiment of the present invention in which the present invention is applied to a vertical heat treatment apparatus will be explained with reference to the drawings attached hereto. First, in FIG. 2, reference numeral 1 represents a vertical heat treatment furnace which is suitable to form films by low-pressure CVD on substrates to be treated, e.g., semiconductor substrates, and has horizontal base plate 2 of, e.g., stainless steel having a circular opening 2a in the central part thereof. Below the base plate 2 a manifold 3 of, e.g., stainless steel which is in the shape of a short cylinder and has outwardly projecting flanges 3a, 3b respectively on the upper end and the lower end is provided in alignment with the axis of the opening 2a. A process tube 4 as a processing vessel of a heat resistant and corrosion resistant material, e.g., quartz is provided air-tight on the manifold 3.

The process tube 4 has the upper end closed and the lower end opened, and has an outward flange 4a on the lower end. An inner tube 5 of quartz having the upper and the lower ends opened is secured to an inward flange 3c formed on an inside of the manifold 3 conically with the process tube 4. Thus a vertical heat treatment furnace of a double tube structure is formed.

In the manifold 3 there are provided a plurality of feed pipes 6 which introduce into the inner tube 5 processing gases from processing gas sources, and an inert gas from an inert gas source, and an exhaust pipe 7 which exhausts the interior of the process tube 4 by pressure reducing means, such as a vacuum pump or other not shown to, e.g., about 10–10⁻⁸ Torr. A heater (heat source) 8, which is in the form of a coil or some other form of heating wires (resistant heating means), such as kanthal wires, heats the interior of the process tube to a high temperature of, e.g., 700°–1200° C., and is disposed around the outside of the process tube 4. The outside of the heater is enclosed by an outer shell 10 in the form of a cooling jacket through a heat insulating material 9. The heater 8, the heat insulating material 9 and the outer shell 10 are carried on the base plate 2.

A cap 11 of, e.g., stainless steel, which is moved up and down by a lift mechanism 12 is provided below the manifold 3. A wafer boat (substrate holding means) 13 of quartz which holds a number (e.g., 150 sheets) of wafers W one above another at a certain interval is provided on the cap 11 through a heat insulating cylinder 14. Rotary drive means which turns the wafer boat 13 may be provided on the cap 11 through the heat insulating cylinder 14 for homogeneous heat treatment on the wafers.

Figure 3:
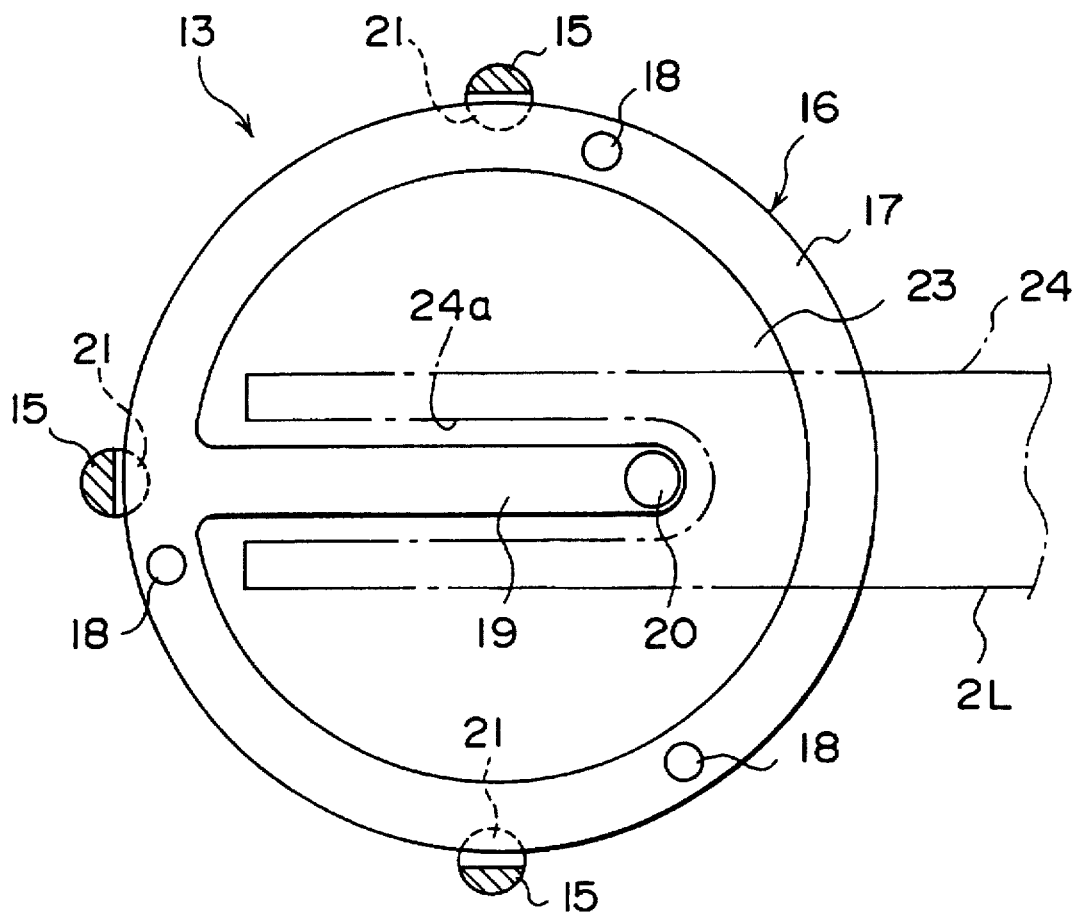
FIG. 3 is a plan view of a wafer boat including the substrate holding means of FIG. 1.
Figure 4:
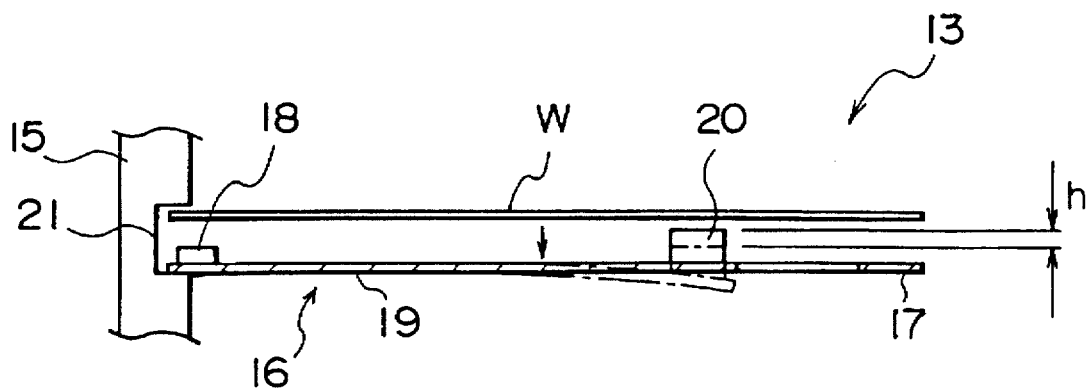
FIG. 4 is a schematic vertical sectional view of the wafer boat of FIG. 3.

As shown in FIGS. 3 and 4, the wafer boat (substrate holding means) 13 includes a plurality (three in the present embodiment) of support rods 15 spaced from each other in such a manner as to encircle the peripheries of disk-shaped wafers W, and a number of substrate supports 16 which bridge the support rods 15 in a horizontal orientation and are spaced at a suitable vertical interval between each other. Each substrate support 16 is singly usable as a substrate support for use in a sheet-type heat treatment apparatus, which treats the wafers W one by one.

Figure 1:
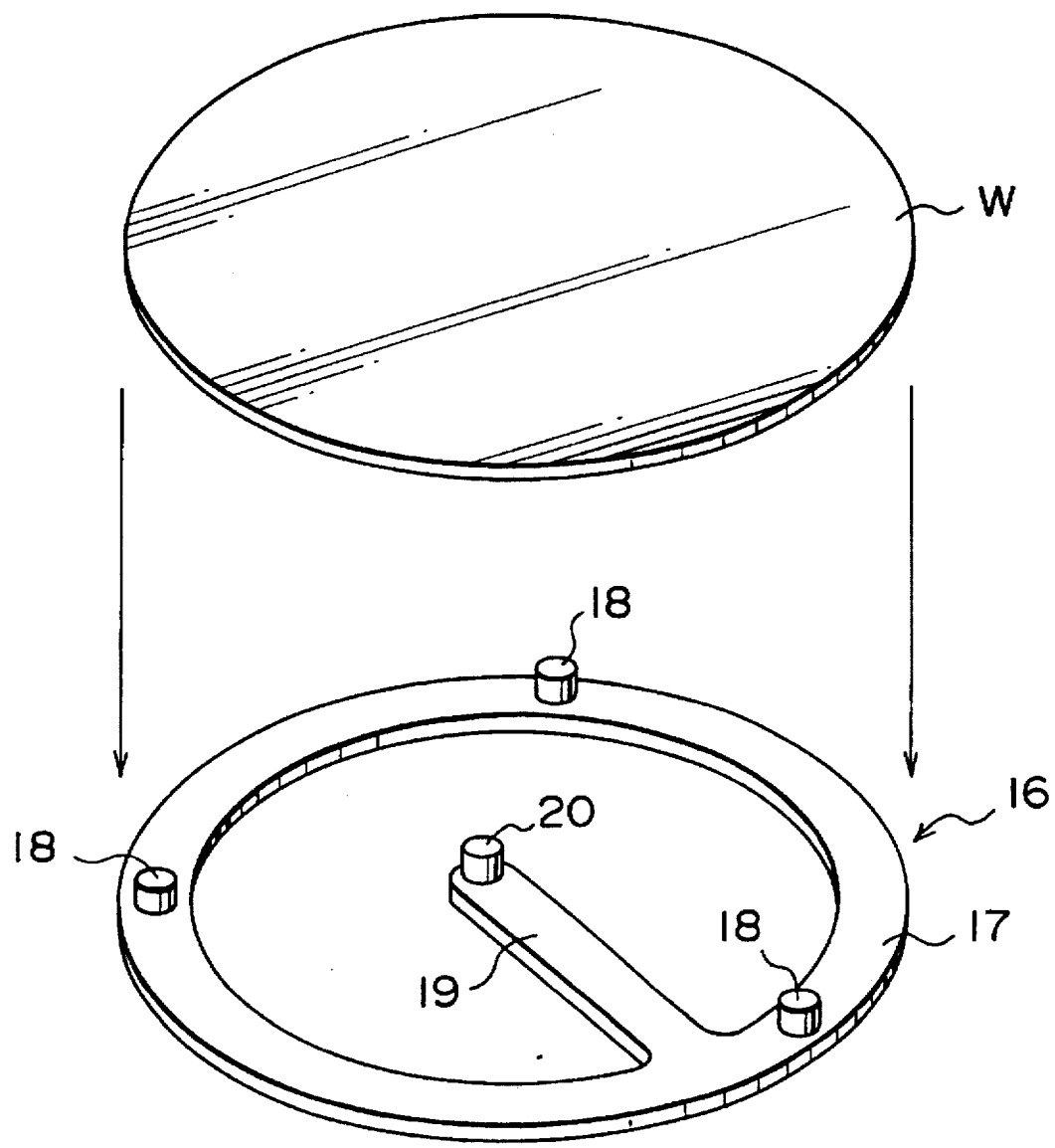
FIG. 1 is a perspective view of the substrate holding means according to one embodiment of the present invention.

As also shown in FIG. 1, each substrate support 16 includes a flat annular base 17 having substantially the same diameter as the wafer W. A plurality (three in the present embodiment) of fixed support projections 18, which support the underside of parts of a peripheral portion of the wafer W (the remaining inner portion of the wafer W is hereinafter called a central portion), are formed upwardly on the top surface of the annular base 17. A beam portion 19 in the shape of an elongate plate is horizontally extended in one-piece with the annular base 17 from a part of the inner periphery of the annular base 17, and the beam portion 19 has flexibility which makes the beam portion 19 flexibly yieldable upward and downward. A flexible support projection 20 which uses the flexibility of the beam portion 19 to flexibly support the underside of a part of the central portion of the wafer W is formed upwardly on the top surface of the forward end of the beam portion 19.

The support rods 15, the annular bases 17, the beam portions 19, the fixed support projections 18 and the flexible support projections 20 are made of quartz but may be formed of silicon carbide (SiC), silicon or others. Especially the beam portion 19 is preferably formed of silicon carbide, which is little thermally deformed.

The respective fixed support projections 18 have the same height and the flexible support projection 20 is higher than the fixed support projections 18 by a height (h) in consideration of a flexure amount of the beam portion 19 at the time when the substrate supports 16 support wafers W (see FIG. 4). The flexible support of the flexible support projections 20 corrects flexure of the central portions of the wafers W which are flexed by their own weight. The support rods 15, the annular bases 17, and the fixed support projections 18 compose a plurality of fixed support portions for supporting wafers W at the undersides of peripheral parts thereof, and the beam portions 19 and the flexible projections 20 compose flexible support portions for supporting the undersides of parts of the central portion of the wafers W.

A width, thickness and length of the beam portions 19, a height (h) of the flexible support projections 20 with respect to the fixed support projections 18 are so set that the peripheral parts of wafers W supported on the fixed support projections 18, and the central portions of the wafers W which are flexed by their own weight and rested on the flexible support projections 20 are in substantially the same horizontal plane. In the present embodiment, the fixed support projections 18 and the flexible support projections 20 are formed in cylinders, but may be in hemispheres or others.

To mount the thus-structured substrate supports 16 on the support rods 16, engagement portions 21 for supporting the undersides of peripheral parts of the annular bases 17 are formed in the support rods 15, and the annular bases 17 are engaged and disengaged into and out of the engagement portions 21 in the horizontal direction. As shown in FIG. 3, the support rods 15 are so arranged that one side (the right side) of the support rods 15 is exposed to permit transfer of the wafers W. The support rods 15 are interconnected to each other at the upper ends and the lower ends thereof by disk-shaped interconnection members 22 (see FIG. 2). The annular bases 17 are so arranged that the beam portions 19 have the forward ends thereof on the side of an entrance 23 of the wafer boat through which wafers W are transferred onto and from the annular bases 17. The forward ends have the flexible support projections 20 and are located beyond the centers of the annular bases 17 and nearer the entrance 23, whereby the flexible support projections 20 on the forward ends of the beam portions 19 flexibly support the undersides of parts of the central portions of the wafers W near the parts of the peripheral portions thereof on the side of the entrance 23. Transfer means for the wafers W includes a tongue-like transfer arm 24 having a cut 24a which precludes interference with the flexible support projections 20 of the beam portions 19. The transfer arm 24 carries a wafer W to transfer the same onto and from the substrate support 16 in a transfer area below the process tube 4.

Then, the operation of the present embodiment will be explained. First, the cap 11 is lowered by the lift mechanism 12 into the transfer area below the process tube 4, and there wafers W are transferred by the transfer arm 24 onto the respective substrate supports 16 of the wafer boat 13 on the cap 11. The wafers W are supported at the undersides of parts of the peripheral portions of the wafers W on said plurality of fixed support projections 18, and at the undersides of parts of the central portions thereof on the flexible support projections 20. The wafers W supported at the undersides of parts of the peripheral portions thereof on the fixed support projections 18 tend to be flexed at the central portions thereof by their own weight. The flexible support projections 20, however, are flexibly displaced downward by the flexibility of the beam portions 19 to support the undersides of parts of the central portions of the wafers W, so that a load on the central portions of he wafers W and the flexibility of the beam portions 19 are balanced to thereby correct flexure of the central portions of the wafers W. At this time, the central portions of the wafers W are in substantially the same horizontal place as the peripheral portions thereof.

When the transfer of the wafers W is thus over, the cap 11 is lifted, and the wafer boat 13 is loaded into the process tube 4 with the cap 11 brought into abutment on the lower flange 36b of the manifold 3, and the process tube 4 is tightly closed. In this state, the interior of the process tube 4 is evacuated by evacuation through the exhaust pipe 7 while an inert gas, e.g., nitrogen gas ($N_2$ gas) is introduced through the feed pipe 6 to replace an atmosphere in the process tube 4 with the $N_2$ gas. Then, the interior of the process tube 4 is heated to a required temperature by a heater 8, and required processing gases are introduced into the process tube 4 through the feed pipe 6. A heat treatment, such as film deposition or others, is conducted.

In the above-described vertical heat treatment apparatus, the wafers W are supported at the undersides of parts of the peripheral portion by the plurality of fixed support projections 18 formed on the annular bases 17 of the substrate supports 16, and at the undersides of parts of the central portions, which are likely to be flexed by their own weight, by the flexible support projections 20, which can be displaced by flexibility of the beam portions 19 extended from parts of the respective annular bases 17, whereby flexure of especially the central portions, which are flexed by their own weight of the wafers W mounted on the annular bases 17, can be corrected. This enables stresses caused in the wafers W to be decreased as much as possible or removed. As a result, occurrence of slips in the wafers W can be precluded in high-temperature heat treatments, and accordingly high yields can be obtained. The annular bases 17 are carried on the plurality of support rods 15, which are suitably spaced from each other, encircling the annular bases 17. The annular bases 17 are also on multi-stages suitably spaced from each other in the direction of height (vertically) of the support rods 15, whereby a number of wafers W can be supported for a simultaneous heat-treatment with flexure of the wafers W corrected.

The wafers W can be supported with flexure thereof corrected by the support structure, which enables the heat treatment apparatus to follow the tendency of larger-diameter wafers. Furthermore, as mentioned in the Background Art, in supporting the undersides of the wafers W at a number of uniformly spaced support points, it is difficult to make a height of the support points uniform with high precision. However, in supporting the undersides of the wafers W at three support points of the fixed support projections 18 as in the present embodiment, the fixed support projections 18 require no precision. This facilitates machining of the heat treatment apparatus. In addition, the relatively simple structure of the substrate supports 16 makes its fabrication relatively easier, which results in lower costs. The substrate supports 16 are singly usable as substrate holding means for use in a sheet-type heat treatment apparatus. Furthermore, the annular bases 17 of the substrate supports 16 are disengageable from the support rods 15 of the wafer boat 13, which facilitates cleaning. The annular bases 17 of the substrate supports 16 are not essentially disengageable from the support rods 15 and may be secured to the support rods 15 by welds or other means.

Next, another embodiment of the present invention will be explained with reference to FIG. 5. Members of the present embodiment of FIG. 5 which are common with the embodiment of FIGS. 1 to 4 are represented by common reference numerals not to repeat their detailed explanation.

Figure 5:
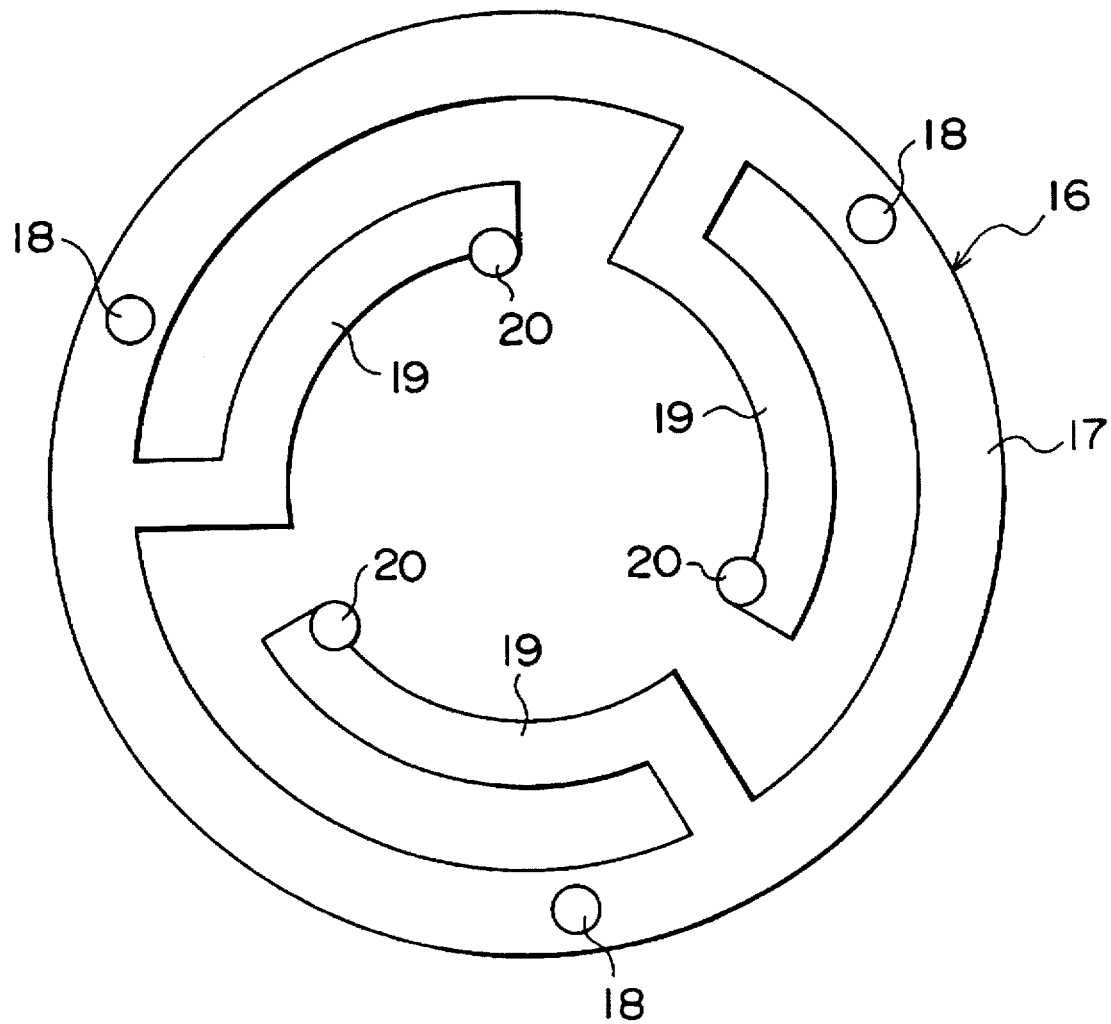
FIG. 5 is a plan view of a wafer boat including the substrate holding means according to another embodiment of the present invention.

In FIG. 5, a plurality (e.g., three) of elongate plate-shaped beam portions 19 are circumferentially extended from the inner periphery of the annular base 17 of each substrate support 16 in one-piece therewith, and flexible support projections 20 are formed on the top surfaces of the respective beam portions 19.

The thus-structured substrate supports 19 are singly used as substrate holding means for use in a sheet-type heat treatment apparatus or mounted on support rods 15 on multi-stages to constitute a part of a wafer boat 13 of a vertical heat treatment apparatus.

According to the present embodiment, the plurality of the beam portions 19 are circumferentially extended from each annular base 17, which can easily secure a length of the beam portions 19 sufficient to provide required flexibility. The wafer W is flexibly supported at the underside of the central portion by flexible support projections 20, which enables stresses caused in the wafer W to be sufficiently decreased or removed.

Figure 6:
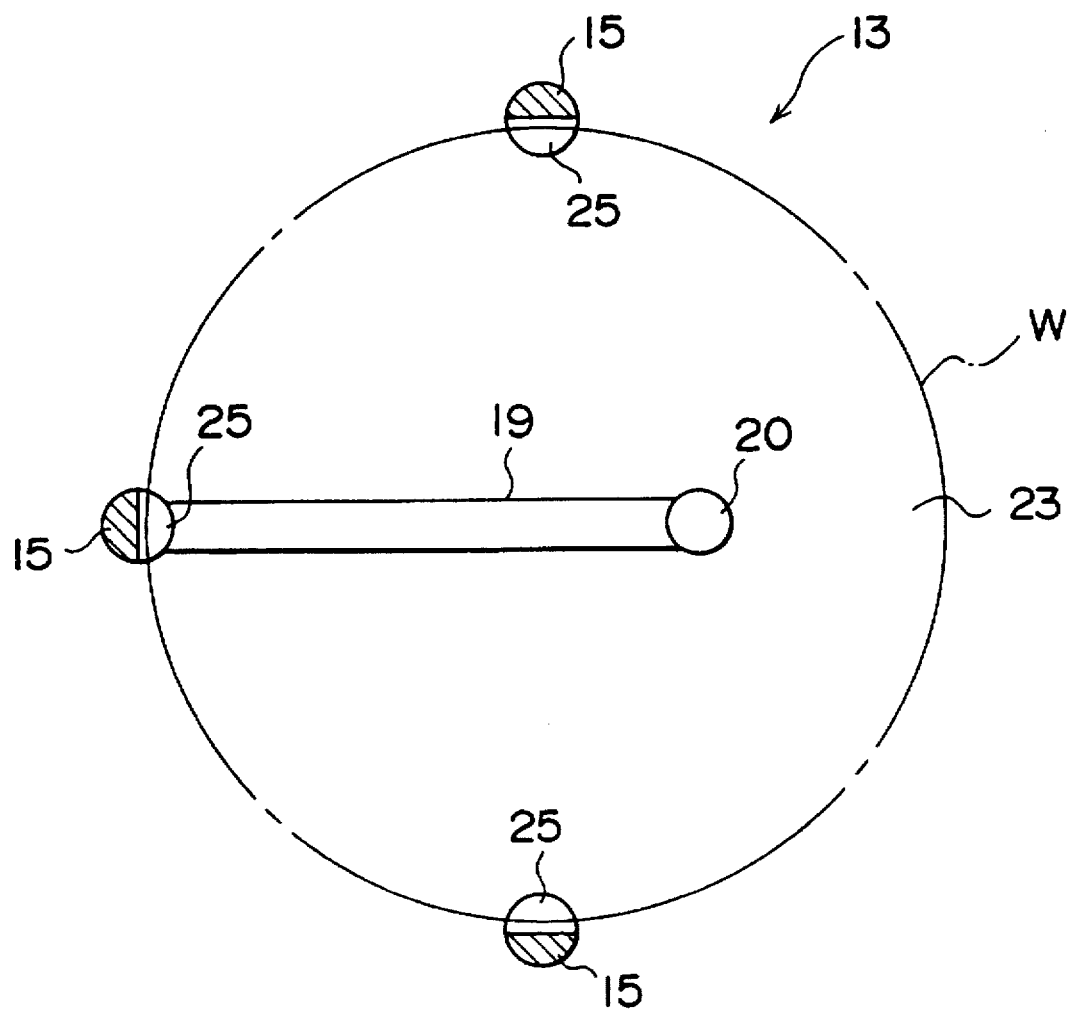
FIG. 6 is a plan view of a wafer boat according to further another embodiment of the present invention.
Figure 7:
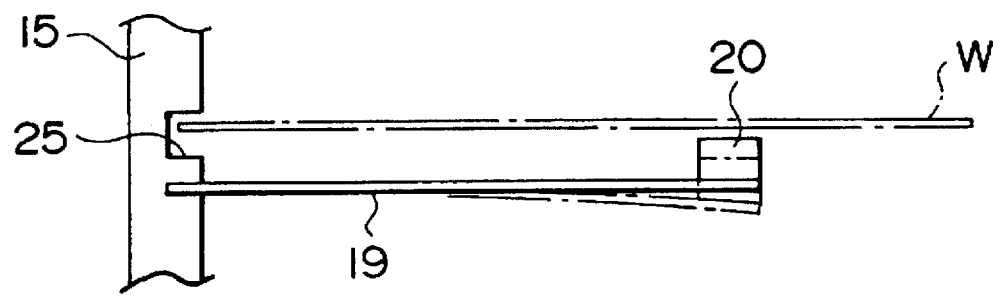
FIG. 7 is a schematic vertical sectional view of the wafer boat of FIG. 6.

A further embodiment of the present invention will be explained with reference to FIGS. 6 and 7. Members of the present embodiment which are common with the embodiments of FIGS. 1 to 4 are represented by common reference numerals not to repeat their explanation. As shown in FIGS. 6 and 7, engagement portions 25 which lock the undersides of the peripheral portions of the wafers W (the rest portion of the wafer W is called hereinafter a central portion) are formed on multi-stages in the support rods 15 at a suitable vertical interval, so that the wafer boat 13 can accommodate a number of wafers W as can a ladder boat. The engagement portions 25 constitute fixed support portions which support the undersides of parts of the peripheral portions of the wafers W.

In the support rod 15 opposed to an entrance 23 of the wafer boat 13, there are provided beam portions 19 which are extended substantially horizontal from parts of the support rod 15 below the engagement portions 25 toward the entrance 23 and are flexible upward and downward. On the top surface of the forward end of each beam portion 19, a flexible support projection 20 which flexibly supports the underside of a part of the central portion of the wafer W, using flexibility of the beam portion 19, is projected higher than the engagement portion 25.

In the vertical heat treatment apparatus including such wafer boat 13, each wafer W is supported at the underside of parts of the peripheral portion thereof by the fixed support portions formed in the support rods 15 of the wafer boat 13, while being supported at the underside of a part of the central portion thereof by the flexible support projection 20 using flexibility of the flexible beam portion 19 extended from said support rod 15, whereby flexure of the wafer W is corrected. As a result, stresses caused in the wafer W can be decreased as much as possible and removed, and occurrence of slips especially in the central portion of the wafer W in a high-temperature heat treatment can be precluded, and accordingly high yields can be Obtained. A number of wafers W can be simultaneously heat-treated. Each flexible support portion has a simple structure including the beam portion 19 provided on the support rod 15 of the wafer boat 13, and the flexible support projection 20 on the forward end of the flexible beam 19. This facilitates the fabrication and lowers costs. The flexible support portion is also applicable to the conventional ladder boats. The present invention is not limited to the above-described embodiments and includes various modifications in the scope of the present invention. For example, the present invention is applicable not only to batch-type vertical heat treatment apparatuses for heat-treating a number of wafers W as described above, but also to sheet-type heat treatment apparatuses. Substrates to be treated are, for example, in addition to semiconductor wafers, LCD substrates, etc. Materials of the substrate holding means are, for example, in addition to quartz, silicon carbide (SiC), etc. In a case that a wafer boat 13 includes the substrate supports 16, it is possible that the rings of the ring boat are used as the annular bases 17 of the substrate supports 16, and the fixed support projections 18 and the beam portions 19 with the flexible support projections 20 are provided on the rings. In the above-described embodiments the fixed support projections support the undersides of parts of the peripheral portions of the wafers W, and the flexible support projections support the undersides of parts of the central portions, but the present invention is not limited to this. For example, it is also possible that the flexible support projections support not only the undersides of parts of the central portions of the wafers, but also the undersides of parts of the peripheral portions of the wafers together with the fixed support projections.

In short, the present invention can produce the following advantageous effect.

(1) Each substrate to be treated W is supported at the underside of parts of thereof by the fixed support portion 17, 18 of the substrate holding means, and is supported by the flexible support portion 19, 20 at the underside of a part thereof which tends to be flexed by its own weight, whereby stresses caused in the substrate to be treated W can be decreased as much as possible or removed. As a result, occurrence of slips in the wafer to be treated W can be precluded in a high-temperature heat treatment, and accordingly higher yields can be obtained, and the substrate holding means is also applicable to the tendency of larger-diameter substrates to be treated W. In addition, the number of the fixed support projections 18 can be three, and the three-point support does not require precision. This makes the machining of the wafer boat easier.

(2) Each substrate to be treated W is supported at the undersides of parts of the peripheral portion thereof by a plurality of fixed support projections 18 of the annular base 17 of the substrate holding means, and supported at the underside of a part of the central portion thereof which is flexed by an own weight of the substrate by the flexible support projection 20 by the use of flexibility of the beam portion 19 extended from the annular base 17, whereby flexure of the substrate W is corrected. Stresses caused in the substrate W can be decreased as much as possible or removed, and occurrence of slips in the substrate can be precluded in a high-temperature heat treatment. High yields can be obtained.

3) A plurality of beam portions 19 are extended circumferentially from the annular bases 17, which makes it easy to secure a length of the beam portions 19 sufficient to obtain required flexibility, and stresses caused in the substrate can be sufficiently decreased or removed.

4) The annular bases 17 are disposed on a plurality of support rods 15, vertically spaced from each other at a suitable interval, whereby a number of substrates to be treated W can be simultaneously supported with flexure thereof corrected and subject to heat treatment.

5) Each substrate to be treated W is supported at the underside of parts of the peripheral portion by the engagement portions 25 in the support rods 15 of the substrate holding means, and at the underside of a part of the central portion thereof by the flexible support portion 20 by the use of flexibility of the beam portion 19 extended from the support rod 15, whereby flexure of the substrate W is corrected. Stresses caused in the substrate W can be decreased as much as possible or removed, and occurrence of slips in the substrate W can be precluded in a high-temperature heat treatment, and high yields can be obtained. In addition, a number of substrates to be treated W can be simultaneously heat-treated.

What is claimed is:

1. A heat treatment apparatus comprising substrate holding means for horizontally supporting a substrate to be treated, the substrate holding means comprising:

a fixed support portion for securely supporting an underside of a peripheral portion of the substrate to be treated, and a flexible support portion connected to said fixed support portion for flexibly supporting the underside of a central portion of the substrate to be treated.

2. A heat treatment apparatus according to claim 1, wherein the fixed support portion comprises a plurality of vertical support rods and an annular base mounted horizontally on said plurality of support rods, and said annular base corresponding to a peripheral portion of the substrate to be treated; and a plurality of fixed support projections for supporting the underside of the peripheral portion of the substrate to be treated mounted on the annular base; and the flexible support portion comprises a beam portion fixed to the annular base and extended in from the annular base, and a flexible support projection for supporting the underside of the central portion of the substrate to be treated.

3. A heat treatment apparatus according to claim 2, wherein the beam portion of the flexible support portion has such flexibility that the peripheral portions of the substrate to be treated is in substantially the same horizontal plane as the central portion thereof when the beam portion supports the underside of the central portion of the substrate to be treated.

4. A heat treatment apparatus according to claim 2, wherein the beam portion of the flexible support portion is extended from the annular base radially inward and beyond the center of the annular base, and the flexible support projection is provided on a part of the beam portion which is beyond the center of the annular base.

5. A heat treatment apparatus according to claim 2, wherein the flexible support portion has a plurality of beam portions which are circumferentially extended.

6. A heat treatment apparatus according to claim 2, wherein the fixed support portion has a plurality of annular bases which are provided on the support rods and vertically spaced from each other at a required interval.

7. A heat treatment apparatus according to claim 2, wherein the beam portion are made of silicon carbide.

8. A heat treatment apparatus according to claim 1, wherein the fixed support portion comprises a plurality of vertical support rods, and engagement portions formed in said plurality of support rods, for supporting the underside of the peripheral portion of the substrate to be treated; and the flexible support portion comprises a beam portion extended inward from at least one of the support rods and a flexible support projection provided on the beam portion for supporting the underside of the central portion of the substrate to be treated.

9. A heat treatment apparatus according to claim 8, wherein the beam portion of the flexible support portion has such flexibility that the peripheral portions of the substrates to be treated are in substantially the same horizontal plane as the central portions thereof when the beam portion supports the underside of the central portion of the substrate to be treated.

10. A heat treatment apparatus according to claim 8, wherein the beam portion of the flexible support portion is extended from said support rod radially inward and beyond the center of a space encircled by the support rods, and the flexible support projection is provided on a part of the beam portion which is beyond the center of the space encircled by the support rods.

11. A heat treatment apparatus according to claim 8, wherein the flexible support portion has a plurality of beam portions which are circumferentially extended.

12. A heat treatment apparatus according to claim 8, wherein the fixed support portion has a plurality of the engagement portions which are provided in the respective support rods and spaced vertically from each other at a required interval.

13. A heat treatment apparatus according to claim 8, wherein the beam portion are made of silicon carbide.

14. A heat treatment apparatus according to claim 2, wherein a top surface of said flexible support projection is at a higher vertical level than a top surface of said fixed support projections when said flexible support portion is in a non-flexed state.

15. A heat treatment apparatus according to claim 3, wherein a top surface of said flexible support projection is at a higher vertical level than a top surface of said fixed support projections when said flexible support portion is in a non-flexed state.

16. A heat treatment apparatus according to claim 1, wherein the flexible support portion comprises a plurality of beam portions which each include a circumferential segment and a radial extension extending between the circumferential segment and said fixed support portion.

17. A heat treatment apparatus according to claim 6, wherein said flexible support portion comprises a plurality of beam portions which extend off from said annular bases.

18. A heat treatment apparatus according to claim 8, wherein said flexible support projection has a substrate contact surface which, when said beam portion is in a non-flexed state, is at a vertical height above a horizontal substrate contact surface of the engagement portions supporting that same substrate.

19. A heat treatment apparatus according to claim 12, wherein said flexible support portion includes a plurality of beam portions which are spaced vertically at the required interval.

20. A heat treatment apparatus according to claim 1, wherein said substrate holding means is a wafer boat which, in use, supports a plurality of wafer substrates.

21. A heat treatment apparatus, comprising:

a substrate holding assembly which includes a fixed support portion which contacts an underside of a peripheral portion of substrates to support the substrates in a horizontal orientation, and said fixed support portion including a plurality of vertical support rods that include vertically spaced support locations that place the horizontally oriented substrates in a vertically spaced, stack arrangement, and said substrate holding assembly further comprising a flexible support portion which includes flexible beams that are supported by said fixed support portion and extend radially inward from said fixed support portion to a central portion of the substrate to be treated such that there is avoided a tendency for the central portion of the substrate to flex downward.

22. The heat treatment apparatus is recited in claim 21, wherein said fixed support portion of said substrate holding assembly includes annular base portions at each of said support locations, and said flexible beams are integral with said annular base portions and extend radially inward therefrom.

23. The heat treatment apparatus as recited in claim 22, wherein both said annular base portions and said flexible beams include vertically extending support projections for contact with a substrate placed on the support projections.

* * * * *